United States Patent
Wu et al.

(10) Patent No.: US 9,378,968 B2
(45) Date of Patent: Jun. 28, 2016

(54) METHOD FOR PLANARIZING SEMICONDUCTOR DEVICE

(71) Applicant: UNITED MICROELECTRONICS CORPORATION, Hsinchu (TW)

(72) Inventors: Yi-Ching Wu, Zhudong Township (TW); Horng-Bor Lu, Hsinchu (TW); Yung-Chieh Kuo, Zhubei (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/474,311

(22) Filed: Sep. 2, 2014

(65) Prior Publication Data

US 2016/0064241 A1    Mar. 3, 2016

(51) Int. Cl.
*H01L 29/94* (2006.01)
*H01L 29/76* (2006.01)
*H01L 21/306* (2006.01)
*H01L 21/283* (2006.01)
*H01L 21/308* (2006.01)

(52) U.S. Cl.
CPC ........ *H01L 21/30625* (2013.01); *H01L 21/283* (2013.01); *H01L 21/308* (2013.01); *H01L 21/30604* (2013.01)

(58) Field of Classification Search
CPC ......... H01L 21/28; H01L 21/30; H01L 29/78; H01L 21/31; H01L 21/302; H01L 21/306
USPC ................... 257/288, 298, E21.19, E21.251, 257/E21.158, 262, 296, 297; 438/68–694
See application file for complete search history.

(56) References Cited

U.S. PATENT DOCUMENTS

| | | | | |
|---|---|---|---|---|
| 5,663,092 A | * | 9/1997 | Lee | H01L 27/10873 257/E21.654 |
| 6,077,784 A | * | 6/2000 | Wu | H01L 21/31053 257/E21.244 |
| 6,258,678 B1 | * | 7/2001 | Liaw | H01L 21/76897 257/E21.507 |
| 6,548,394 B1 | * | 4/2003 | Peng | H01L 21/76895 257/296 |
| 6,913,993 B2 | * | 7/2005 | Wu | H01L 21/31053 257/E21.244 |
| 7,799,630 B2 | | 9/2010 | Yu | |
| 2002/0060332 A1 | * | 5/2002 | Ikeda | H01L 27/115 257/298 |
| 2003/0025137 A1 | * | 2/2003 | Takahashi | H01L 21/76897 257/288 |
| 2003/0183860 A1 | * | 10/2003 | Uchiyama | G03F 9/7076 257/296 |
| 2004/0038466 A1 | * | 2/2004 | Yen | H01L 21/28194 438/197 |
| 2004/0195596 A1 | * | 10/2004 | Wang | H01L 21/76895 257/222 |
| 2006/0124592 A1 | * | 6/2006 | Miller | C09G 1/02 216/88 |

(Continued)

*Primary Examiner* — Jessica Stultz
*Assistant Examiner* — Sheikh Maruf
(74) *Attorney, Agent, or Firm* — Ding Yu Tan

(57) ABSTRACT

A method for planarizing a semiconductor device is provided. The method includes steps hereinafter. A substrate is provided with a first dielectric layer covering at least one electrode structure formed thereon. A chemical-mechanical polishing (CMP) process is performed on the first dielectric layer until the at least one electrode structure is exposed. A second dielectric layer is deposited covering the at least one electrode structure and the first dielectric layer. An etching-back process is performed on the second dielectric layer until the at least one electrode structure is exposed.

9 Claims, 4 Drawing Sheets

(56) References Cited

U.S. PATENT DOCUMENTS

| | | | |
|---|---|---|---|
| 2007/0099125 A1* | 5/2007 | Chen | H01L 21/76885 430/311 |
| 2007/0210351 A1* | 9/2007 | Tsuchiya | H01L 21/823835 257/288 |
| 2007/0228427 A1* | 10/2007 | Matsui | H01L 27/10852 257/288 |
| 2008/0001236 A1* | 1/2008 | Change | 257/401 |
| 2008/0248649 A1* | 10/2008 | Adetutu | H01L 21/02164 438/692 |
| 2009/0261396 A1* | 10/2009 | Gogoi | H01L 21/764 257/298 |
| 2009/0286384 A1* | 11/2009 | Wu | H01L 21/76883 438/584 |
| 2010/0078690 A1* | 4/2010 | Sugiyama | H01L 21/02164 257/288 |
| 2010/0081262 A1* | 4/2010 | Lim | H01L 21/823842 438/479 |
| 2010/0207201 A1* | 8/2010 | Masuoka | H01L 27/0207 257/329 |
| 2011/0129984 A1* | 6/2011 | Funayama | H01L 21/76229 438/424 |
| 2012/0032238 A1* | 2/2012 | Teo et al. | 257/288 |
| 2012/0171854 A1 | 7/2012 | He | |
| 2012/0248519 A1* | 10/2012 | Shinhara | H01L 27/10823 257/296 |
| 2012/0264279 A1 | 10/2012 | Lu | |
| 2013/0062701 A1* | 3/2013 | Lee | H01L 29/66545 257/369 |
| 2013/0181265 A1 | 7/2013 | Grasshoff | |
| 2013/0320452 A1* | 12/2013 | Wann | H01L 21/823425 257/368 |
| 2013/0341685 A1* | 12/2013 | Chou | H01L 29/6653 257/288 |
| 2014/0001540 A1* | 1/2014 | Wang et al. | 257/329 |
| 2014/0030880 A1* | 1/2014 | Liang et al. | 438/586 |
| 2014/0252430 A1* | 9/2014 | Loechelt | H01L 29/42368 257/288 |
| 2014/0252431 A1* | 9/2014 | Lee et al. | 257/288 |
| 2015/0008488 A1* | 1/2015 | Hall et al. | 257/288 |

* cited by examiner

METHOD FOR PLANARIZING SEMICONDUCTOR DEVICE

FIELD OF THE INVENTION

The present invention generally relates to a method for planarizing a semiconductor device and, more particularly, to a method for planarizing a dielectric layer on a semiconductor device.

BACKGROUND OF THE INVENTION

The integrated circuit (IC) manufacturing technology have been moving forward as the metal-oxide-semiconductor field-effect transistors (MOSFETs) become smaller and smaller to improve the performances such as increased switching speed, lowered power consumption and higher level of integration. HKMG (high-k metal gate) technology promises to enable scaling of the transistors as well as reduced stand-by power due to a reduction in gate leakage.

In the HKMG technology, an interlayer dielectric layer is typically polished by a chemical-mechanical polishing (CMP) process before removing a polysilicon dummy gate. The CMP process of the interlayer dielectric layer is important for the performance of the metal gate formed in subsequent steps. After polishing, however, seams, voids or scratches may form on the surface of the interlayer dielectric layer, and metal residues may remain therein after deposition and polishing of a metal layer for forming a metal gate. As a result, electrical shorts or metal bridging may occur.

To overcome these problems, U.S. Pat. No. 7,799,630, for example, discloses a method for forming a metal gate using CMP and etching back processes. However, the seams, voids or scratches still exist.

Accordingly, there is need in providing a method for planarizing a semiconductor device that is free of seams, voids or scratches on the surface of the interlayer dielectric layer.

SUMMARY OF THE INVENTION

It is one object of the present invention to provide a method for planarizing a semiconductor device using a sacrificial dielectric layer deposited and etched back to prevent the formation of metal residuals on the surface of the interlayer dielectric layer, so that performance deterioration can be avoided and the reliability of the semiconductor device can be improved.

In order to achieve the foregoing object, in one embodiment, the present invention provides a method for planarizing a semiconductor device, comprising steps of: providing a substrate with a first dielectric layer covering at least one electrode structure formed thereon; performing a chemical-mechanical polishing (CMP) process on the first dielectric layer until the at least one electrode structure is exposed; depositing a second dielectric layer covering the at least one electrode structure and the first dielectric layer; and performing an etching-back process on the second dielectric layer until the at least one electrode structure is exposed.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiment. It is to be noted that the following descriptions of the preferred embodiment of this invention are presented herein for purpose of illustration and description only. It is not intended to be exhaustive or to be limited to the precise form disclosed.

Figure 1A:
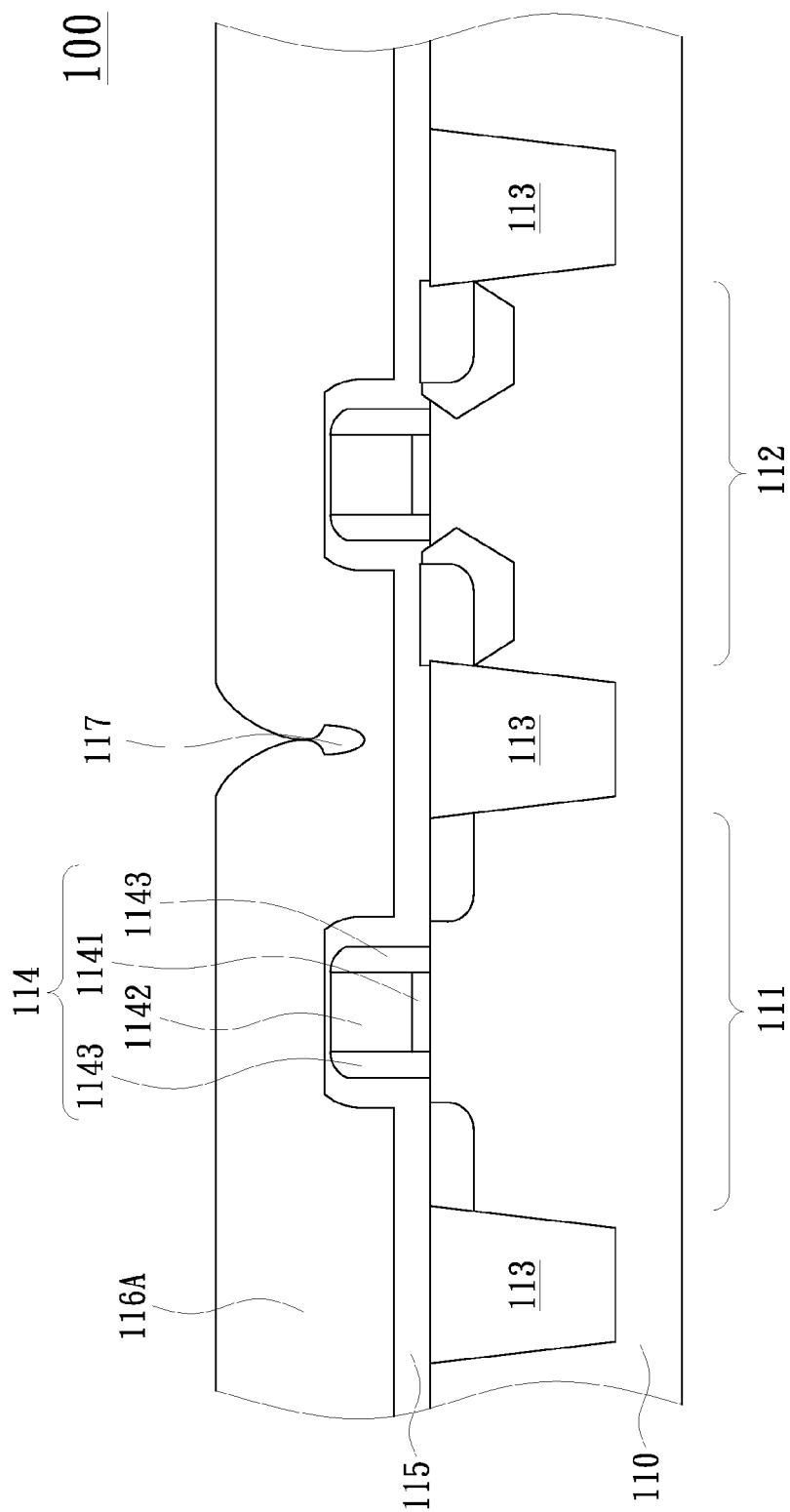
FIG. 1A to FIG. 1D are cross-sectional views showing the steps for a method for planarizing a semiconductor device according to one embodiment of the present invention.

Please refer to FIG. 1A to FIG. 1D for cross-sectional views showing the steps for a method for planarizing a semiconductor device 100. As shown in FIG. 1A, a substrate 110 is provided with a first dielectric layer 116A covering at least one electrode structure 114 formed on the substrate 110.

In one embodiment, the substrate 110 can be a silicon substrate, a III-V semiconductor substrate, a sapphire substrate, a silicon on insulator (SOI) substrate, or any other substrates with electronic components thereon. For example, as shown in FIG. 1A, the substrate 110 is a silicon substrate having at least one n-channel MOSFET 111 and at least one p-channel MOSFET 112 that are separated by a shallow trench isolation (STI) structure 113. Each of the MOSFETs 111 and 112 has a gate electrode structure 114 on the surface of the substrate 110. The gate electrode structure 114 comprises a high-k dielectric layer 1141, a polysilicon layer 1142 and a spacer 1143. Preferably, the gate electrode structure 114 is covered with an etching stop layer 115. In one embodiment, the etching stop layer 115 is an oxynitride layer or a nitride layer.

In the present embodiment, the first dielectric layer 116A is an oxide layer or any other low-k dielectric layers formed by deposition. For example, the first dielectric layer 116A is a carbon doped oxide layer. It is noted that, in the formation of the first dielectric layer 116A, a plurality of voids 117 may be formed due to the step height difference between the top surfaces of the etching stop layer 115 and the gate electrode structure 114.

Figure 1B:
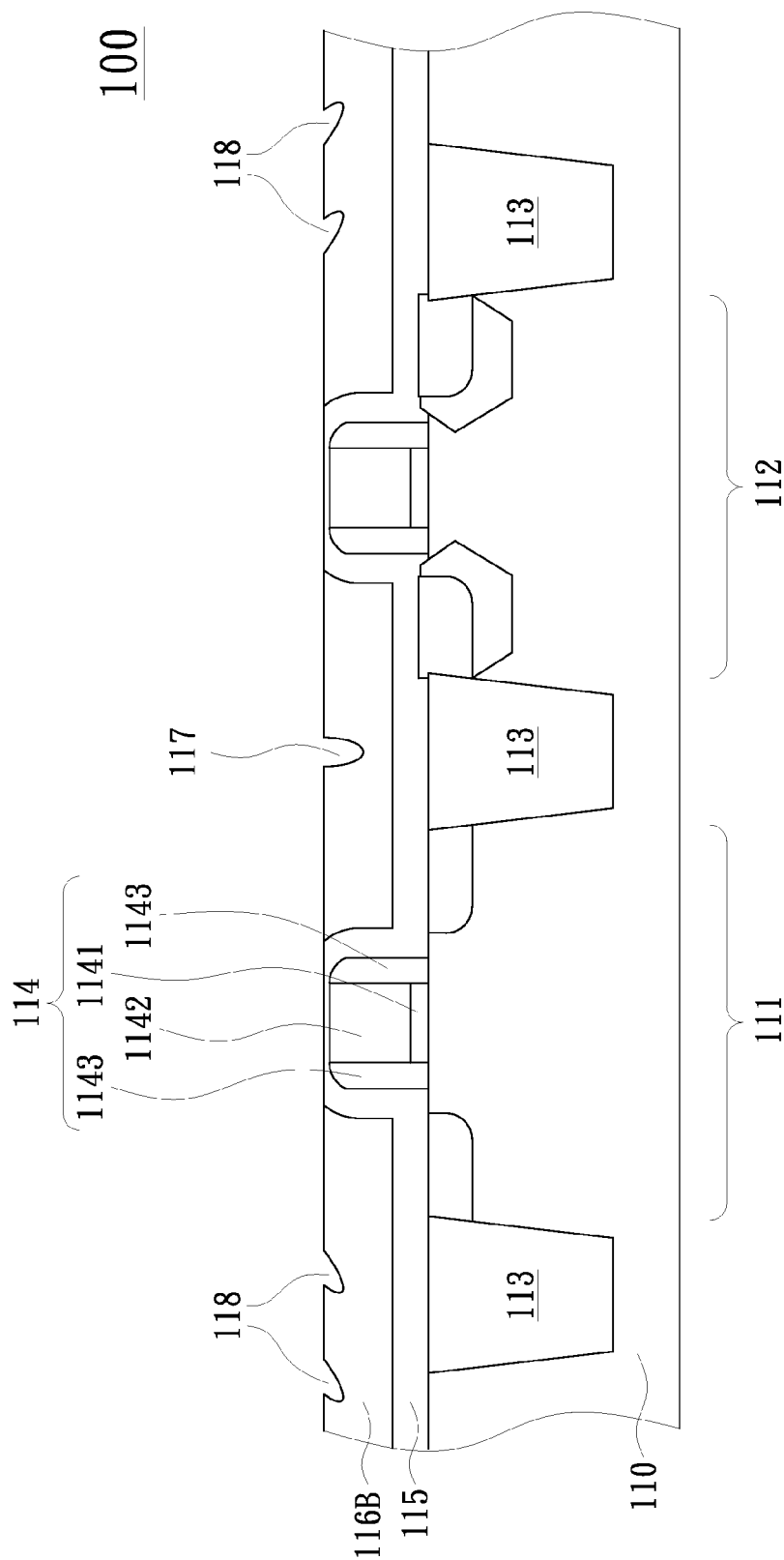

Next, a chemical-mechanical polishing (CMP) process is performed on the first dielectric layer 116A until the gate electrode structure 114 is exposed, which may leave the voids 117 and a plurality of scratches 118 on the surface of the remaining first dielectric layer 116B, as shown in FIG. 1B.

Figure 1C:
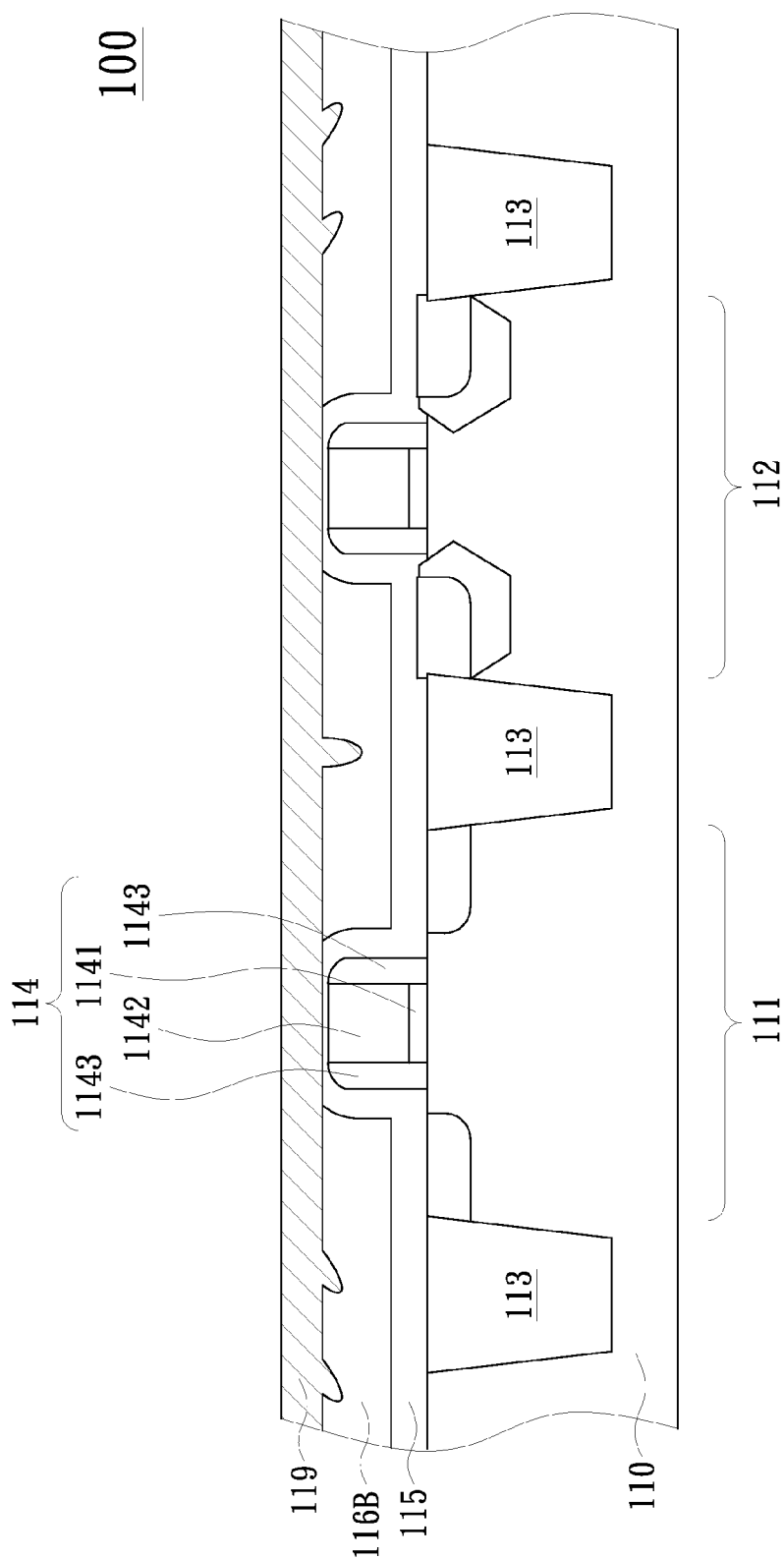

After the CMP process, as shown FIG. 1C, a second dielectric layer 119 is deposited covering the gate electrode structure 114 and the remaining first dielectric layer 116B to fill the voids 117 and the scratches 118, which are previously shown in FIG. 1B. In one embodiment, the second dielectric layer 119 is an oxide layer, a nitride layer or an oxynitride layer formed by deposition. In the present embodiment, the first dielectric layer 116A (including also the remaining first dielectric layer 116B) and the second dielectric layer 119 can be made of the same material or of different materials.

Figure 1D:
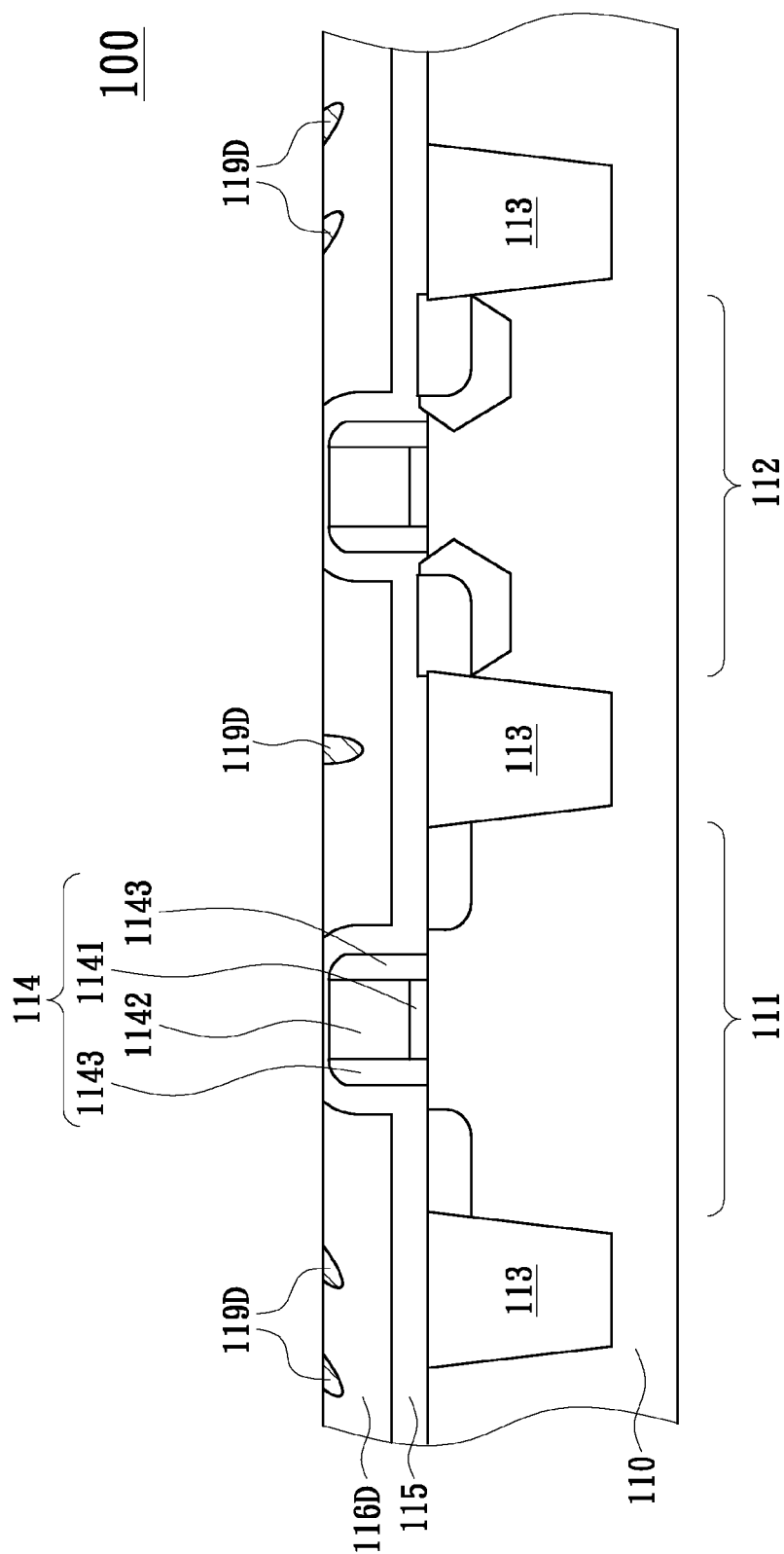

Then, an etching-back process is performed on the second dielectric layer 119 until the gate electrode structure 114 is exposed. As shown in FIG. 1D, the remaining second dielectric layer 119D still fill the voids 117 and the scratches 118 previously shown in FIG. 1B, resulting in a planar surface of the first dielectric layer 116D that is free of seams, voids or scratches on the surface thereof. In one embodiment, the etching-back process is a dry etching process or a wet etching process. It is preferable that an etching recipe, for dry etching or wet etching, providing no etching selectivity between the first dielectric layer 116B (116D) and the second dielectric layer 119 is used.

With of realization of the present invention, the formation of seams, voids or scratches on the surface of the interlayer dielectric layer (i.e., the first dielectric layer) due to deposition and polishing of the interlayer dielectric layer can be prevented by using a sacrificial dielectric layer (i.e., the second dielectric layer). Therefore, the formation of metal residuals on the surface of the interlayer dielectric layer can be prevented so that performance deterioration or failure due to electrical shorts or metal bridging can be avoided. Accordingly, the reliability of the semiconductor device can be improved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for planarizing a semiconductor device, comprising steps of:
   providing a substrate with a first dielectric layer covering at least one electrode structure formed thereon;
   performing a chemical-mechanical polishing (CMP) process on said first dielectric layer until said at least one electrode structure is exposed, wherein a plurality of voids and scratches are produced by the CMP process on a surface of said first dielectric layer;
   depositing a second dielectric layer so as to cover said at least one electrode structure and fill-in the plurality of voids and scratches produced by the CMP process on the surface of said first dielectric layer; and
   performing an etching-back process on said second dielectric layer until said at least one electrode structure is exposed, wherein said second dielectric layer is substantially removed, but with only a portion of said second dielectric layer being remained to form a remaining second dielectric layer with the surface of said first dielectric layer with the plurality of voids and scratches thereon being only filled with the second dielectric layer, which thereby together forming a planar surface.

2. The method of claim 1, wherein said first dielectric layer is an oxide layer.

3. The method of claim 2, wherein said first dielectric layer is a carbon doped oxide layer.

4. The method of claim 1, wherein said first dielectric layer is a low-k dielectric layer.

5. The method of claim 1, wherein said second dielectric layer is an oxide layer, an oxynitride layer or a nitride layer.

6. The method of claim 1, wherein said etching-back process is a dry etching process or a wet etching process.

7. The method of claim 1, wherein said etching-back process uses an etching recipe that provides no etching selectivity between said first dielectric layer and said second dielectric layer.

8. The method of claim 1, wherein said least one electrode structure is covered with an etching stop layer.

9. The method of claim 8, wherein said etching stop layer is an oxynitride layer or a nitride layer.

* * * * *